US008651379B2

(12) United States Patent
Thielmann et al.

(10) Patent No.: US 8,651,379 B2
(45) Date of Patent: Feb. 18, 2014

(54) SWITCHGEAR CABINET OR RACK

(75) Inventors: Bodo Thielmann, Siegbach (DE);
Markus Hain, Dillenburg (DE); Volker Schmidt, Siegen (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 13/138,363

(22) PCT Filed: Feb. 17, 2010

(86) PCT No.: PCT/EP2010/000981
§ 371 (c)(1),
(2), (4) Date: Oct. 17, 2011

(87) PCT Pub. No.: WO2010/094459
PCT Pub. Date: Aug. 26, 2010

(65) Prior Publication Data
US 2012/0031964 A1    Feb. 9, 2012

(30) Foreign Application Priority Data

Feb. 19, 2009   (DE) .......................... 10 2009 009 641

(51) Int. Cl.
*G06K 7/00*   (2006.01)
*G06F 19/00*   (2011.01)

(52) U.S. Cl.
USPC ............ 235/385; 235/375; 235/439; 235/451

(58) Field of Classification Search
USPC ............... 235/375, 383, 385, 451, 492, 439; 340/10.1, 10.3, 572.1, 572.2; 361/724–727, 790, 797
See application file for complete search history.

(56) References Cited

U.S. PATENT DOCUMENTS

| | | | | |
|---|---|---|---|---|
| 5,034,861 A * | 7/1991 | Sklenak et al. | ................. | 362/92 |
| 6,042,244 A * | 3/2000 | Witkoski | ....................... | 362/133 |
| 6,714,121 B1 * | 3/2004 | Moore | ......................... | 340/10.3 |
| 6,741,442 B1 * | 5/2004 | McNally et al. | ............... | 361/166 |

(Continued)

FOREIGN PATENT DOCUMENTS

| | | |
|---|---|---|
| DE | 10 2007 034 437 A1 | 5/2008 |
| WO | WO 2009/091888 A1 | 7/2009 |

OTHER PUBLICATIONS

English Translation for DE102007034437.*

*Primary Examiner* — Tuyen K Vo
(74) *Attorney, Agent, or Firm* — Marshall & Melhorn, LLC (57) ABSTRACT

The invention relates to a switchgear cabinet or rack comprising a mounting unit, the front of which has vertical mounting profiles that laterally delimit an installation space for installed user-side units, said profiles having fixing sections for attaching mounting sections of the installed units, and comprising components of a detection device for determining the presence of an installed unit in an installation position of the installation space. he components of the detection device have a vertical detector strip that is attached to a mounting profile and contains detector elements associated with the installed positions and arranged on or in said strip and code carriers that are provided on the installed units, the information from said carriers being transmitted for evaluation via the detector elements to a monitoring and control unit, either wirelessly or by wire. Clearly-represented user information is achieved for the switchgear cabinet using light elements mounted on or in the detector strip, said elements being associated with the installation positions and achieved by the fact that the light elements can be controlled in accordance with the information in the code carriers.

15 Claims, 13 Drawing Sheets

(56) References Cited

U.S. PATENT DOCUMENTS

| | | | |
|---|---|---|---|
| 6,813,896 B1* | 11/2004 | Janke et al. | 62/126 |
| 6,889,345 B2* | 5/2005 | Sicola et al. | 714/43 |
| 7,259,683 B2 | 8/2007 | Abe | |
| 7,857,214 B2 | 12/2010 | Saliaris | |
| 2003/0126253 A1* | 7/2003 | Ewing et al. | 709/223 |
| 2006/0097863 A1* | 5/2006 | Horowitz et al. | 340/521 |
| 2006/0102718 A1* | 5/2006 | Kajino et al. | 235/385 |
| 2006/0283944 A1* | 12/2006 | Holley | 235/385 |
| 2008/0272887 A1* | 11/2008 | Brey et al. | 340/10.1 |
| 2009/0195363 A1 | 8/2009 | Downie et al. | |
| 2010/0116885 A1* | 5/2010 | Dearing et al. | 235/385 |
| 2010/0187306 A1* | 7/2010 | Solomon | 235/385 |

* cited by examiner

SWITCHGEAR CABINET OR RACK

BACKGROUND OF THE INVENTION

The invention relates to a switchgear cabinet or rack comprising a mounting unit, the front of which has vertical mounting profiles that laterally delimit an installation space for installed user-side units, said profiles having fixing sections for attaching mounting sections of the installed units, and comprising components of a detection device for determining the presence of an installed unit in an installation position of the installation space, wherein the components of the detection device have a vertical detector strip that is attached to a mounting section and contains detector elements associated with the installed positions and arranged on or in said strip and code carriers that are provided on the installed units, the information from said carriers being transmitted for evaluation via the detector elements to a monitoring and control unit, either wirelessly or by wire.

Such a switchgear cabinet or such a rack, respectively, is specified in DE 10 2007 034 437 A1. In this known switchgear cabinet, a device for detecting installation components inserted therein is equipped with a detection unit which is connected or may be connected to an evaluation and recording device. In one embodiment, the detection unit comprises a detector strip which is arranged on the mounting plane of installed units and is screwed or adhesively bonded to a frame leg or mounting part, said strip including antenna elements which are sensitive without contact and positioned within grid of one or more units and heights, and transponders, in particular RFID tags, which are arranged at the installed units. The strip-shaped antenna array thereby can be combined from several antenna modules plugged by means of plug-coupling units which respectively comprise a narrow, longitudinal extending, strip-like plastic housing for covering several units of height. Said housing which may also extend over the total height of the accommodating region for the installed units possesses fixing features for mounting e.g. at a vertical mounting rail at which also the installed units are attached. Said transponders or RFID tags, respectively, are positioned in the front region of the installed units, in particular server units, at their housing adjacent to said detector strip, so that the antenna elements read information in a near field of the respectively associated transponders which is transmitted to the evaluation and recording device via a data line, or as an alternative, in a wireless manner. The respective RFID tag possesses a unique identification and characterizes the installed unit to be detected which is read via the relevant antenna element under control of a control unit and is transmitted to the evaluation unit together with the associated height position. Attachment of the RFID tags to the installed unit is made by adhesive bonding or screwing. Unique identification of the passive transponder or RFID tag built up in such a manner takes place already at the manufacturing plant.

Mounting of the detector strip in the region of the mounting plane of the switchgear cabinet or rack results in beneficial mounting possibilities and a favourable signal detection in conjunction with the transponders. However, for information of the user, often a quick recognition of the installation situation of its devices locally is desirable.

The invention is based on the object to provide a switchgear cabinet or rack of the type mentioned in the introductory which results in an extended user guidance.

SUMMARY OF THE INVENTION

This object is solved by the features of claim 1. Hereby it is provided that illuminating elements are mounted on or in the detector strip which are associated with the installation positions, and that the illuminating elements can be controlled in accordance with the information in the code carriers.

By these features, a clear optical information is offered to the user also in the area of the switchgear cabinet or rack.

Those features are advantageous for a configuration with accurate display of position and effective operation that said illuminating elements are light emitting diodes and that said monitoring and control devices are also configured to drive the light emitting diodes.

Configuration and controlling of the illuminating elements are favoured by said illuminating elements and said detector elements, at least partly sharing data lines and/or supply lines arranged in said detector strip.

Various information can be represented by driving said illuminating elements to emit light of different color and/or temporal illuminating frequency.

Those features contribute to an advantageous construction and easy mounting that said detector strip comprises a housing body having a hollow profile.

An advantageous embodiment consists in that said hollow profile comprises a square, rectangular, round, C-shaped or U-shaped cross section and is provided on its front in a mounted state with a transparent cover part at least in sections in front of the illuminating element and further in that said hollow profile being U-shaped in cross section comprises a flat base leg with perpendicularly oriented lateral legs which, seen in cross section, are as long as, longer than or shorter than the base leg.

Benefits for construction and function also result by providing the lateral legs with retaining grooves on their inner side in the region of their exposed longitudinal edges which grooves oppose each other with their opening faces and which forwardly and rearwardly engage behind the inserted cover part along the longitudinal edges thereof.

A further embodiment which is advantageous for function and integration of the detecting device is achieved in that the detection strip is configured as antenna strip and the detector elements are configured as antenna elements and that the code carriers are configured as transponder elements, in particular RFID tags.

Functioning and mounting are further favoured by said fixing sections being flat and lying on a front mounting plane, that the antenna strip lying with its front on the mounting plane or being set back in relation thereto by a maximum of 10 mm and the relevant code carrier being arranged in front of the front of the detector strip and is fixed on a support section of the retaining element overlapping the detector strip which element is attached to the neighbouring mounting section of the associated installed unit via a connecting section.

Those features contribute to an advantageous user guidance that the illuminating elements are arranged in longitudinal direction of the detector strip in regular grid spacing within grid of a unit of height HE or an integer multiple thereof or in regular partial spacing thereof, are individually controllable and are, in an illuminating state, accurately visible through said transparent cover part and/or spaced antenna elements being arranged in longitudinal direction of the antenna unit in the interior of said antenna strip within grid of a unit of height HE or an integer multiple thereof or a regular partial spacing thereof.

An advantageous exact arrangement is achieved in that said mounting profile comprises a cavity which is at least partly adjusted to the cross section of the detector strip, having an abutment section set back in relation to the mounting plane by at least the cross section depth of the antenna strip and having an inner boundary wall delimiting the cavity on its face facing the installation space, that the abutment section and the inner boundary wall are perpendicularly arranged in cross section of the cavity, wherein the abutment section is oriented parallel to the mounting plane and that the boundary wall merges, via an intermediate section or immediately, perpendicularly into said fixing section.

An embodiment which is advantageous for mounting consists in that a row of retaining holes comprising retaining holes which are arranged in regular grid spacing is arranged in said abutment section and that the retaining holes are square or rectangular having longitudinal sides running in longitudinal direction of the mounting profile and that the detector strip is provided with retaining hooks on the rear facing the abutment section which are harmonized with the spacing of the retaining holes or a multiple thereof and comprise vertical hook sections which possess a smaller length than the clear opening width of the retaining holes in a vertical direction and which are spaced from the rearward outer face of the detector strip so that the engage behind a wall region of the bearing section surrounding the retaining holes with a clamping force.

Construction and function are also favoured in that said retaining element is flat and is arranged with its connecting section on the rear of the mounting section which is also flat and is pressed therewith against the front of the fixing section and that the support section extends its height along a fraction of the connecting section.

BRIEF DESCRIPTION OF THE DRAWINGS

The invention will be explained below with the aid of exemplary embodiments with reference to the drawings. It is shown in:

in FIG. 9C a longitudinal section of the antenna strip and in FIG. 9D a cross section of the antenna strip, FIG. 10 various views of the front mounting frame of the switchgear cabinet or rack having lateral vertical mounting profiles and a lower and an upper frame leg, as well as enlarged detail representations, FIG. 11 the front mounting frame of the switchgear cabinet or rack in a perspective view, FIG. 12 a detail of the mounting frame of FIG. 11 in a connecting region of two strip modules that are pushed apart from another;

DETAILED DESCRIPTION OF THE INVENTION

Figure 1:
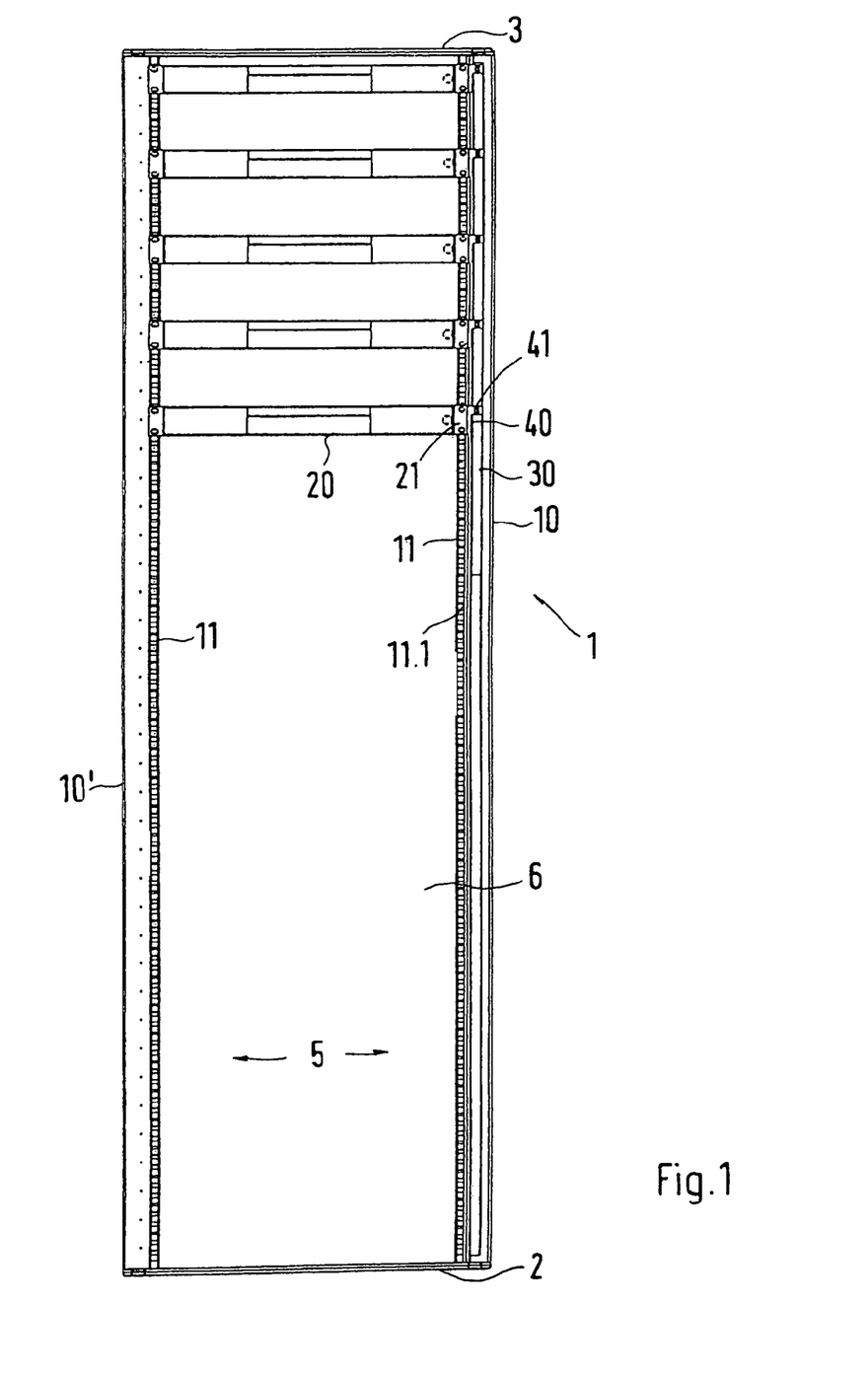
FIG. 1 a front mounting plane of a switchgear cabinet or rack.

FIG. 1 shows a front view of a mounting plane 5 of a framework 1 of a switchgear cabinet or rack comprising several inserted installed units 20, such as e.g. server units, their height being for example one HE. Mounting plane 5 is laterally bound by front mounting faces of two vertical mounting profiles 10, 10' and at the bottom by a lower frame leg 2 and at the top by an upper frame leg 3. Fixing sections 11 of said mounting profiles having rows of holes 11.1 adjoin on both sides at the edges of mounting profiles 10, 10' delimiting the clear installation opening, said rows of holes possessing a narrow hole grid spacing of presently three fixing holes per unit of height HE. Mounting profiles 10, 10' can be formed by lateral frame profiles of the framework and/or by separate mounting profiles.

Installed units 20 comprise laterally projecting flat mounting sections 21 which extend along the height of housings of installed units 20 and protrude beyond fixing sections 11 on both sides. In mounting sections 21, e.g. respectively two mounting holes 21.1 (cp. e.g. also FIG. 4), for example, are presently introduced in a double spacing of fixing holes 11.2 of row of holes 11.1 so that mounting holes 21.2 respectively skip one fixing hole 11.2.

Figure 2:
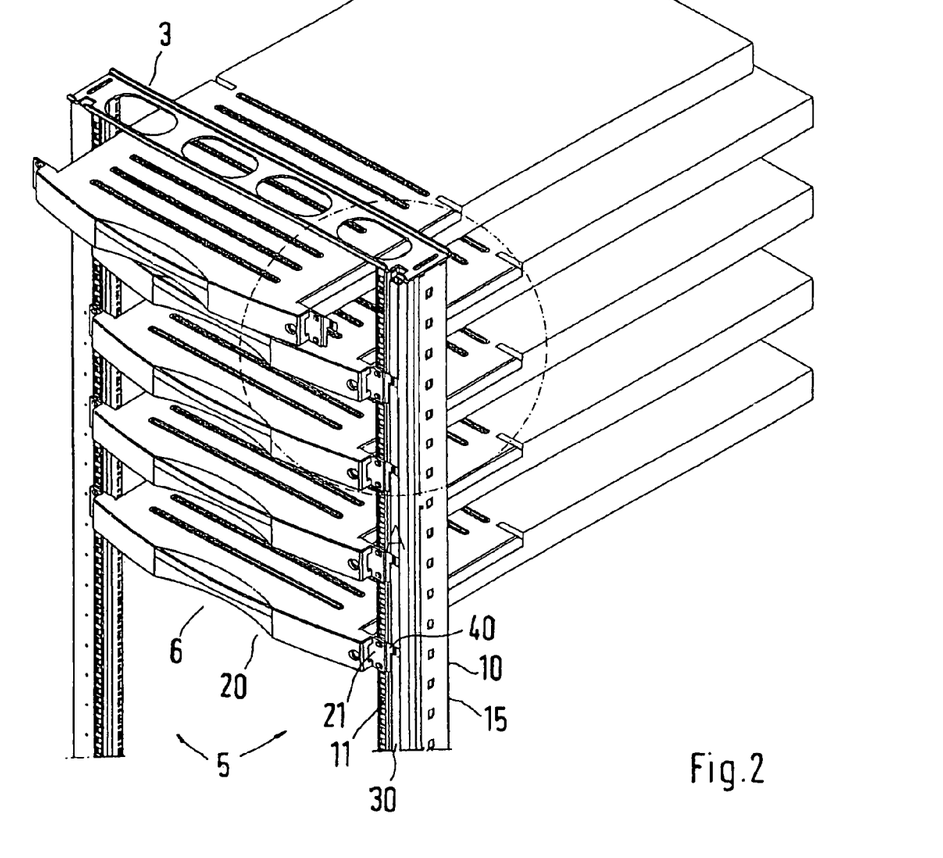
FIG. 2 a detail of an installation space of a switchgear cabinet or rack with front side mounting plane and vertical mounting profiles in a perspective view, FIG. 3 a detail of the mounting plane in the region of a mounting section, FIG. 4 a detailed view of the switchgear cabinet or rack in an upper front corner region of the installation space and of the mounting plane with several inserted installed units, FIG. 5 a detail of the switchgear cabinet or rack in an upper front corner region with inserted antenna strip and a retaining element with transponder in a perspective view, FIG. 6 a detail of the fixing plane in the region of a mounting section with vertical mounting profile, inserted antenna strip and attached retaining element with transponder, FIGS. 7A to 7C a perspective view, a front view and a view of the rear end face of a retaining element with transponder element, FIG. 8 a perspective detail representation of the front upper corner region of the switchgear cabinet or rack with an antenna strip prior to its mounting, FIGS. 9A to 9D in FIG. 9A a perspective view of a section of the antenna strip at an angle to the rear, in partial images a), b) and c) of FIG. 9B the antenna strip in a front view, in a side view and in a rear view.
Figure 3:
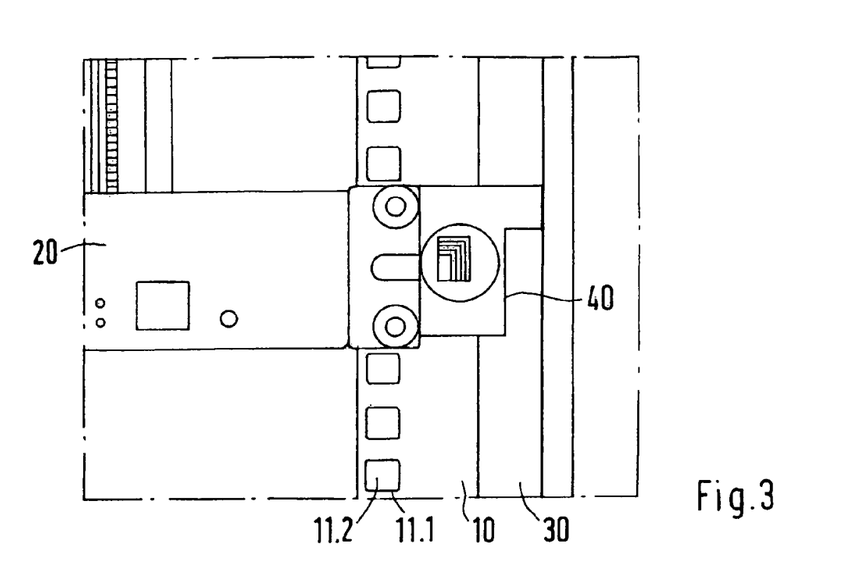
Figure 4:
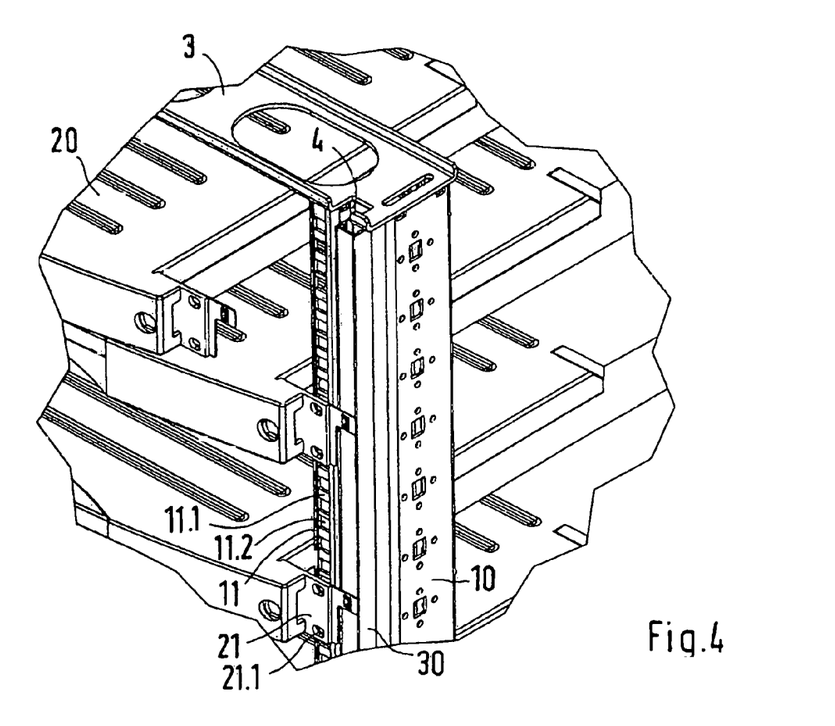
Figure 5:
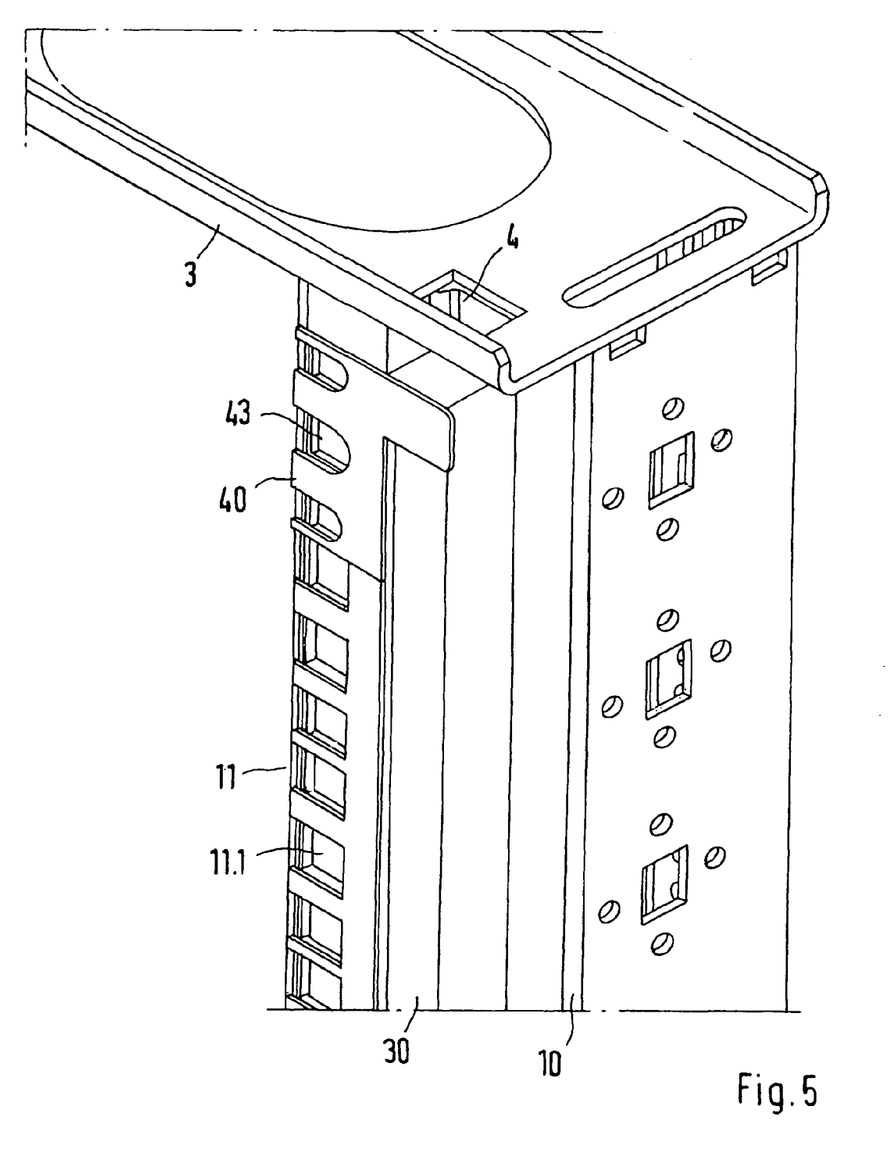

In a region of a lateral mounting section, presently right hand mounting section 21 in front view, respective retaining elements 40 are arranged, for example adhesively bonded to mounting section 21 or at least clamped therebetween and fixing section 11, wherein a tongue-like support section 41 protrudes laterally and an antenna strip 30 inserted into said mounting profile 10 overlaps at the front, as can be clearer seen in the detailed illustration of FIG. 2 and in further illustrations of FIGS. 3, 4 and 5.

Figure 7A:
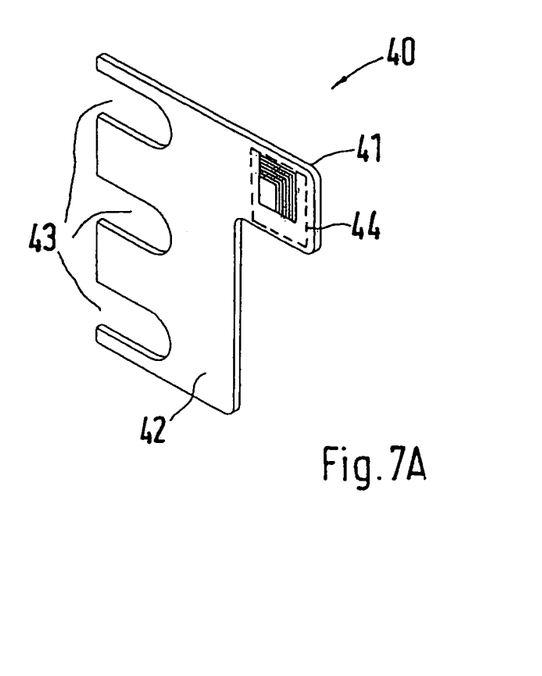
Figure 7B:
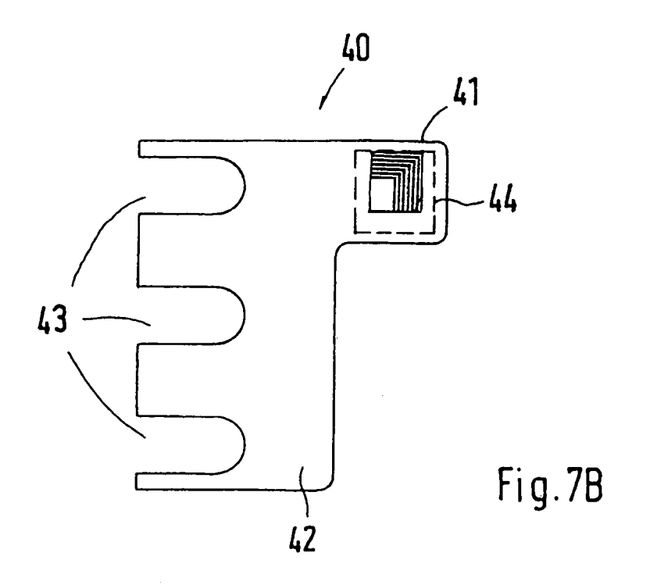
Figure 7C:
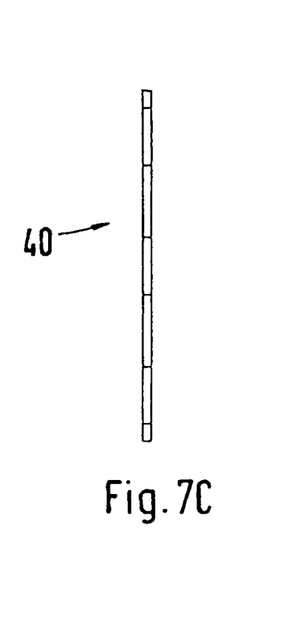

In FIGS. 7A, 7B, 7C retaining element 40 is reproduced individually in different views. Retaining elements 40 are made from flat plate-like material of small thickness of e.g. at most about 1 mm, for example metal or plastic, preferably by punching or cutting or by forming. Retaining element 40 comprises a connecting section 42 with openings 43 introduced therein which are open to the edge remote from support section 41 and have the shape of a portal. The vertical height dimension in a mounted state preferably corresponds to the height of mounting section 21, which normally corresponds to the housing height of an installed unit, thus e.g. one or more units of height, while lateral width dimension of connecting section 42 roughly corresponds to the width of mounting section 21 so that in the installed state the outer edge of connecting section 42 is approximately flush with the outer edge of mounting section 21, and also the upper and the lower edges of connecting section 42 and mounting section 21 are approximately flush. Support section 41, which extends only along a fraction, e.g. ½, ⅓, ¼ of the height of connecting section 42, which upper edge runs for example in extension of the upper edge of the connecting section, is preferably opaque and carries transponder element 44, in particular embodied as RFID tag, which is attached e.g. by adhesive bonding.

As shown in FIG. 2 in a perspective illustration, retaining elements 40 made of flat leaflet-shaped material for example of metal or plastic, are clamped via a connecting section 42 between the flat rear of the relevant mounting section 21 and the flat front of fixing section 11, wherein they were previously advantageously fixed to mounting section 21, for example by means of an adhesive layer applied thereto which is covered by a releasable protection sheet in a non-applied state. Mounting holes 21.1 harmonized with openings 43 regarding position and dimension, are introduced into connecting section 42 so that installed units 20 inserted into installation space 6 and abutting with their mounting sections 21 at fixing section 11 can be unhinderedly fastened to fixing sections 11 by means of screws as shown in FIG. 3. As can be further seen in FIG. 5, also openings 43 are aligned with respective fixing holes 11.2 of rows of holes 11.1.

Figure 6:
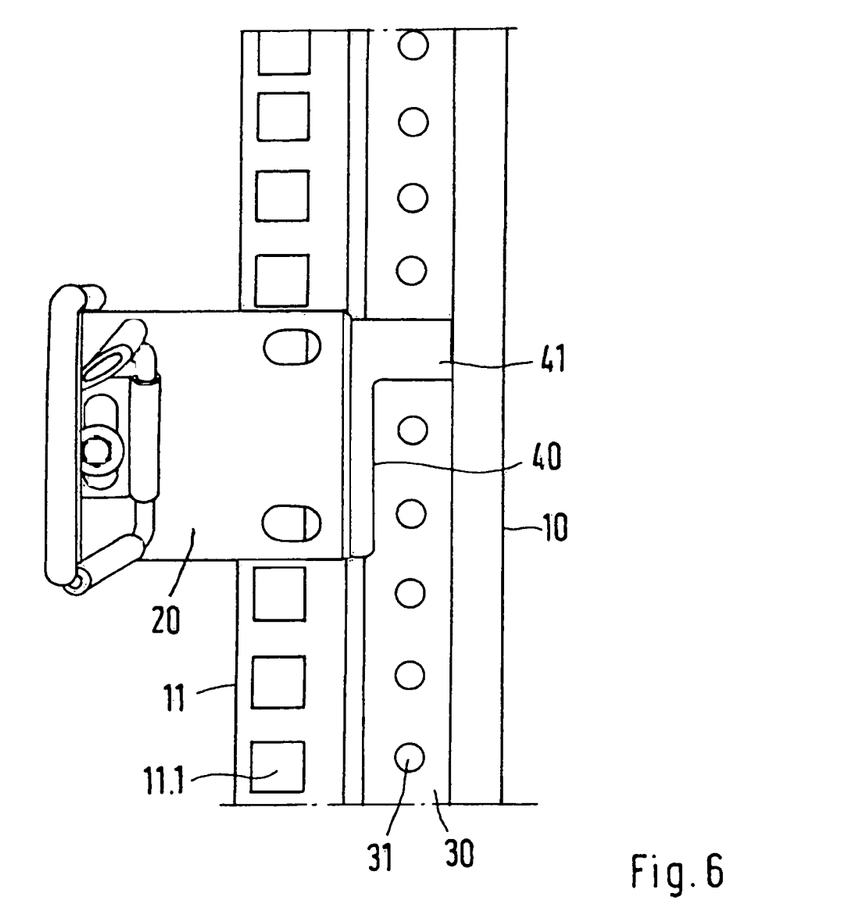
Figure 8:
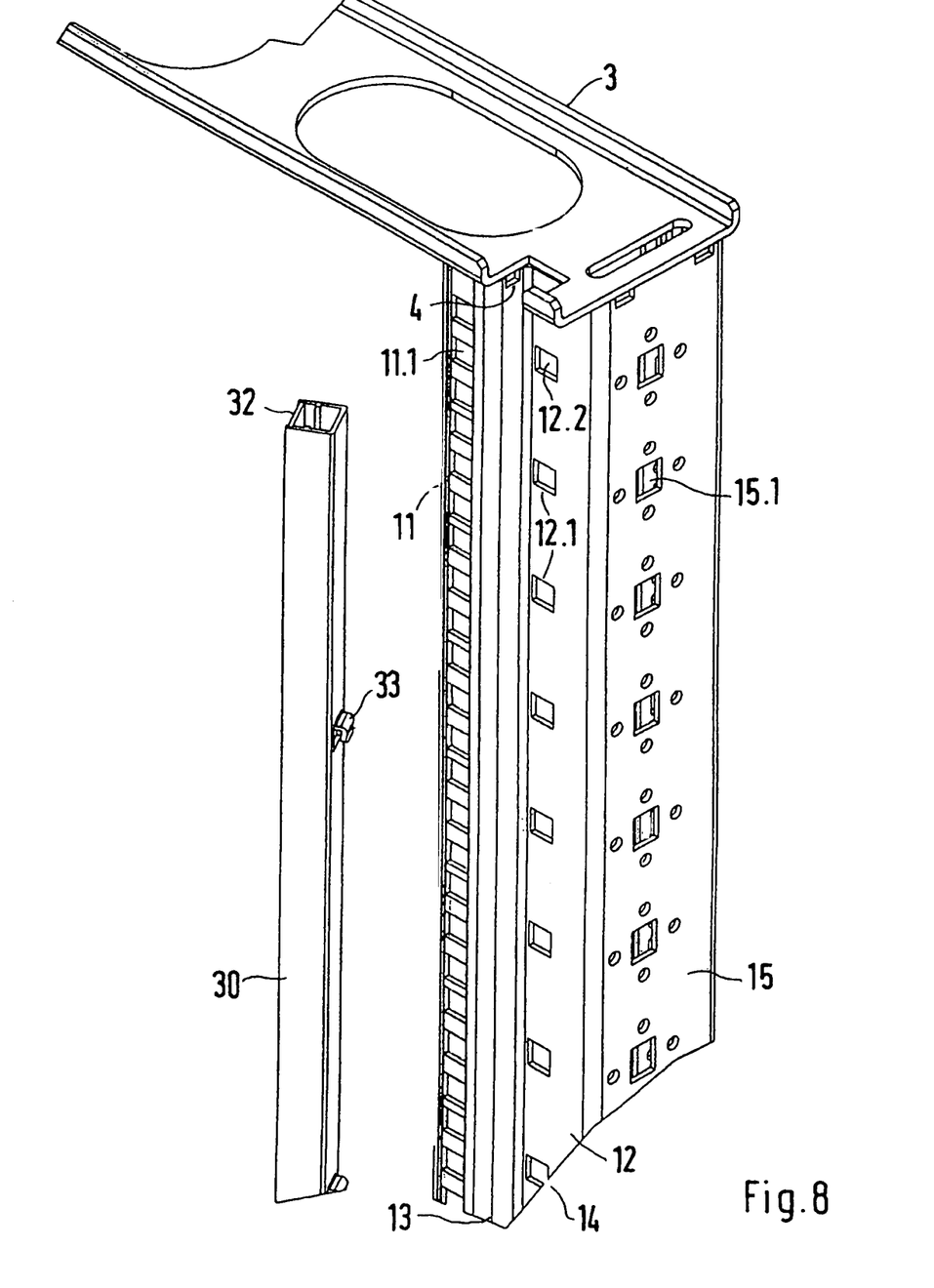
Figure 9A:
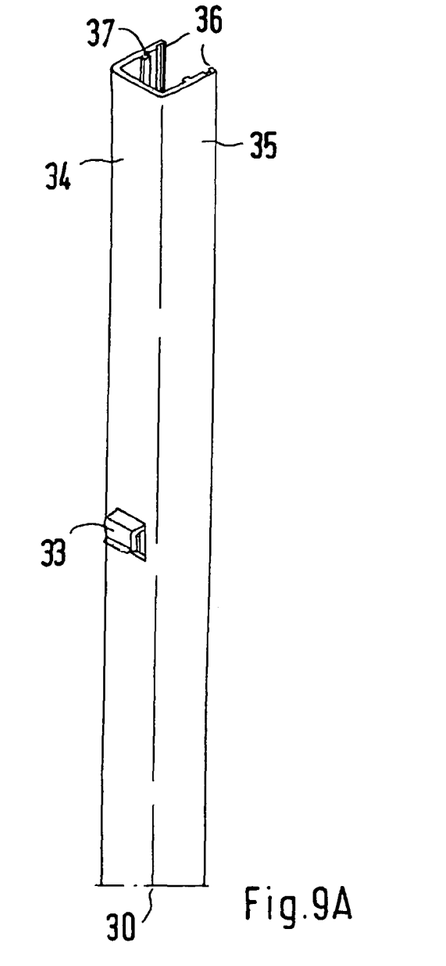
Figure 9B:
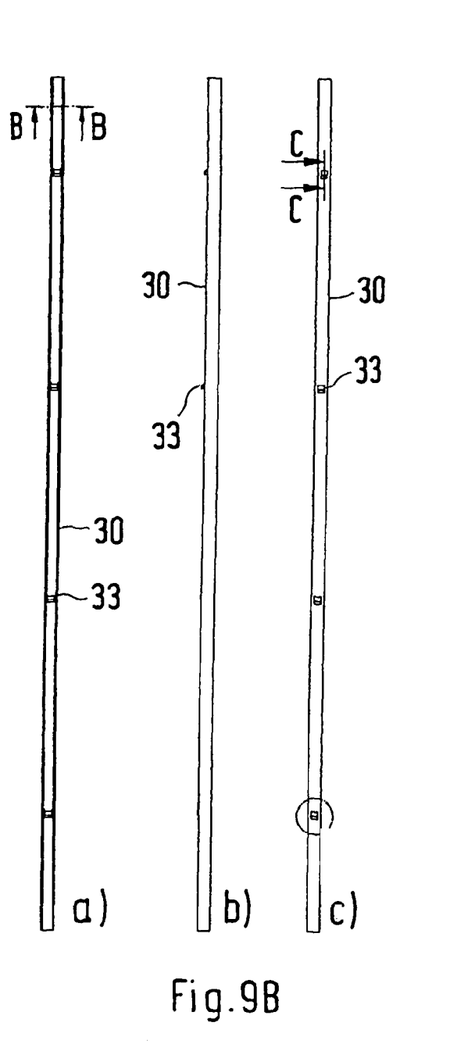
Figure 9C:
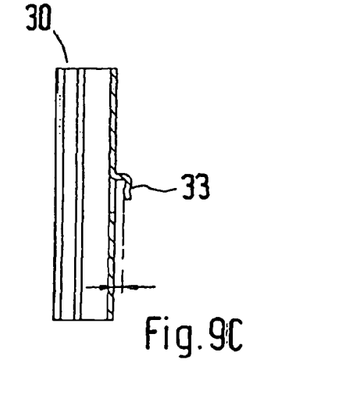
Figure 9D:
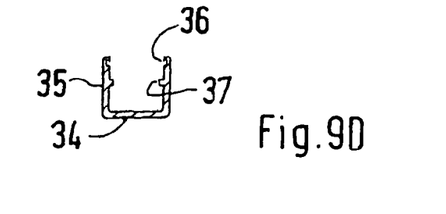

As shown in FIG. 2 and in particular in the enlarged detailed illustration of FIG. 4 as well as also in FIGS. 5, 6 and 8, at least that mounting profile on the right hand side in a front view, to which antenna strip 30 is allocated, is provided with an inner boundary wall 13 of a cavity 14 for antenna strip 30 neighboring exteriorly the respective fixing section 11. Inner boundary walls 13 merges perpendicularly from its rear end remote from the front into an outwardly facing abutment section 12 in depth of cavity 14, to which antenna strip 30 is brought in abutment when inserted. Thereby, front of abutment section 12 is set back such a distance from the front mounting plane or the plane of fixing section 11, respectively, that antenna strip 30 does not protrude beyond front plane of fixing section 11 with its front face and is preferably flush therewith or is set back only a little bit. In particular in a flush arrangement of the front of antenna strip 30 on the front mounting plane, support section 41 carrying a transponder element 44 on its rear which is formed in particular as a RFID tag, is arranged at a distance to antenna strip 30 and antenna elements contained therein which distance is as small as possible so that a small transmission distance for transmission of information between transponder element 44 and the relevant antenna element will result.

As further seen in FIG. 8, a row of retaining holes 12.1 with at least two retaining holes 12.2 is formed in abutment section 12 which comprise a regular hole grid spacing in a vertical direction, for example in intervals of one or more units of height. Retaining holes 12.2 are rectangular or square and are aligned horizontally or vertically, respectively, with respect to the longitudinal direction of mounting profile 10 or 10", respectively, with their hole boundary sides. Antenna strip 30 is provided with hook elements 33 on its rear which are for example produced by partly punching and bending the rear wall, wherein downwardly directed hook noses are formed which are spaced from the rear wall plane of antenna strip 30 by somewhat less than the wall thickness of the abutment section 12 around retaining holes 12.2., wherein said downwardly directly section is outwardly bent away from the rear wall plane of antenna strip 30 at its lower end section, so that easy engagement is achieved. Thereby, downwardly directed hook section is shorter than vertical opening clearance of retaining holes 12.2. Several such hooked elements are arranged along the length of antenna strip 30 which are harmonized with the hole grid spacing of retaining holes 12.2 or a multiple thereof. Further, the width of the hooks is harmonized with the width of retaining holes 12.2 such that they fit into retaining holes 12.2 with lateral slack which is as small as possible. Having these measures, antenna strip 30 can be inserted easily and precisely into support 14 and can be engaged with the front of abutment section 12 by its rear and subsequently be fixed by downward pushing, wherein retaining hooks 33 lead to a slight clamping effect.

As further shown in FIG. 8, a recess 4 is formed in upper horizontal frame leg 3 which also may be a mounting leg, flush with respect to the inserted antenna strip 30, which recess is at least as large as the outer cross section of antenna strip 30, so that it can unhinderedly be inserted even if it extends in an inserted state into the region of the upper end of vertical mounting profiles 10 or 10', respectively, to use also the upper installation position of installation space 6. Thus, antenna strip 30 can be inserted protruding beyond vertical frame profile 10 or 10', respectively, and then pushed downwardly for fixing.

As further shown in FIGS. 2, 4, 5 and 8, abutment section 12 merges at its outer edge into an outer side wall section 15 of mounting profile 10 or 10', respectively, which is oriented backwards and in which a further vertical row of holes 15.1 with holes for mounting purposes is arranged. Cupport 14 could even be provided on its outer side with a further wall parallel to inner boundary wall 13 which protrudes with its front at most to the front mounting plane.

As shown in FIG. 8 and furthermore in FIGS. 9A to 9D, antenna strip 30 possesses a housing having a U-shaped, e.g. square or rectangular section having a base leg 34 and two lateral legs 35. A cover part 32 is inserted, for example snapped or engaged, into the front face, which is in a mounted state oriented to the front face of the switchgear cabinet or rack, respectively. Longitudinally running retaining grooves 36 for holding cover part 32 are formed near the free edge of lateral legs 35 on their inner side which overlap the free edges of preferably flat cover part 32 on its front and rear. Cover part 32 may also or in addition be glued. Furthermore, opposing holding ribs 37 are formed on the inside of lateral legs 35 which are offset inside with respect to retaining grooves 36, so that inside the U-shaped housing of antenna strip 30 further elements can be fixed, for example by means of fixed platelets, such as e.g. said antenna elements and supply lines as well as illuminating elements 31 (c.p. FIGS. 6) to be described below. Preferably, cover part 32 is made permeable to light in a translucent or transparent manner, so that light of illuminating elements 31 penetrates and illuminating elements are clearly recognizable in their position, the interior of antenna strip 30, however, is preferably non visible. Appropriate is a correspondingly clouded glass having a light attenuation which is as small as possible and e.g. without selective spectral filter characteristics.

As it is shown in FIG. 6, illuminating elements 31 are also arranged in uniform grid spacing along the length of antenna strip 30, wherein e.g. three illuminating elements 31 per unit of height HE are inserted. Two of these illuminating elements 31 are exposed aside mounting section 21 or connecting section 42 of retaining element 40 and are in a driven illuminating state when installed unit 20 is inserted, while a third illuminating element 31 per unit of height is covered by support section 41 of retaining element 40 when installed unit 20 is inserted which retaining element extends in vertical direction only along one third of a unit of height HE. Thus, installation positions are displayed to a viewer which can be visually well recognized, wherein occupied installation positions can be easily perceived. Illuminating elements 31 can be driven by a control unit (not shown), as for example described in DE 10 2007 034 437 A1 mentioned in the introductory, wherein different driving modes are possible, e.g. in various colors by using light emitting diodes which can be driven to emit different colors or in various flash modes or in a continuous light operation, respectively. Illuminating elements 31 are thereby driven dependent on information received from transponder elements 44 and transferred to the control unit via the antenna elements. Antenna elements can be arranged with same grid spacing and closely adjacent to illuminating elements 31, so that unique detection of information and positional allocation can be achieved. Further signaling can be controlled dependent on the operating state of the installed units, characteristics which are e.g. programmed on the manufacturing side into transponder elements 44 and their installation position, wherein the control unit may also cooperate with a superordinate evaluation unit and with register units.

Figure 10:
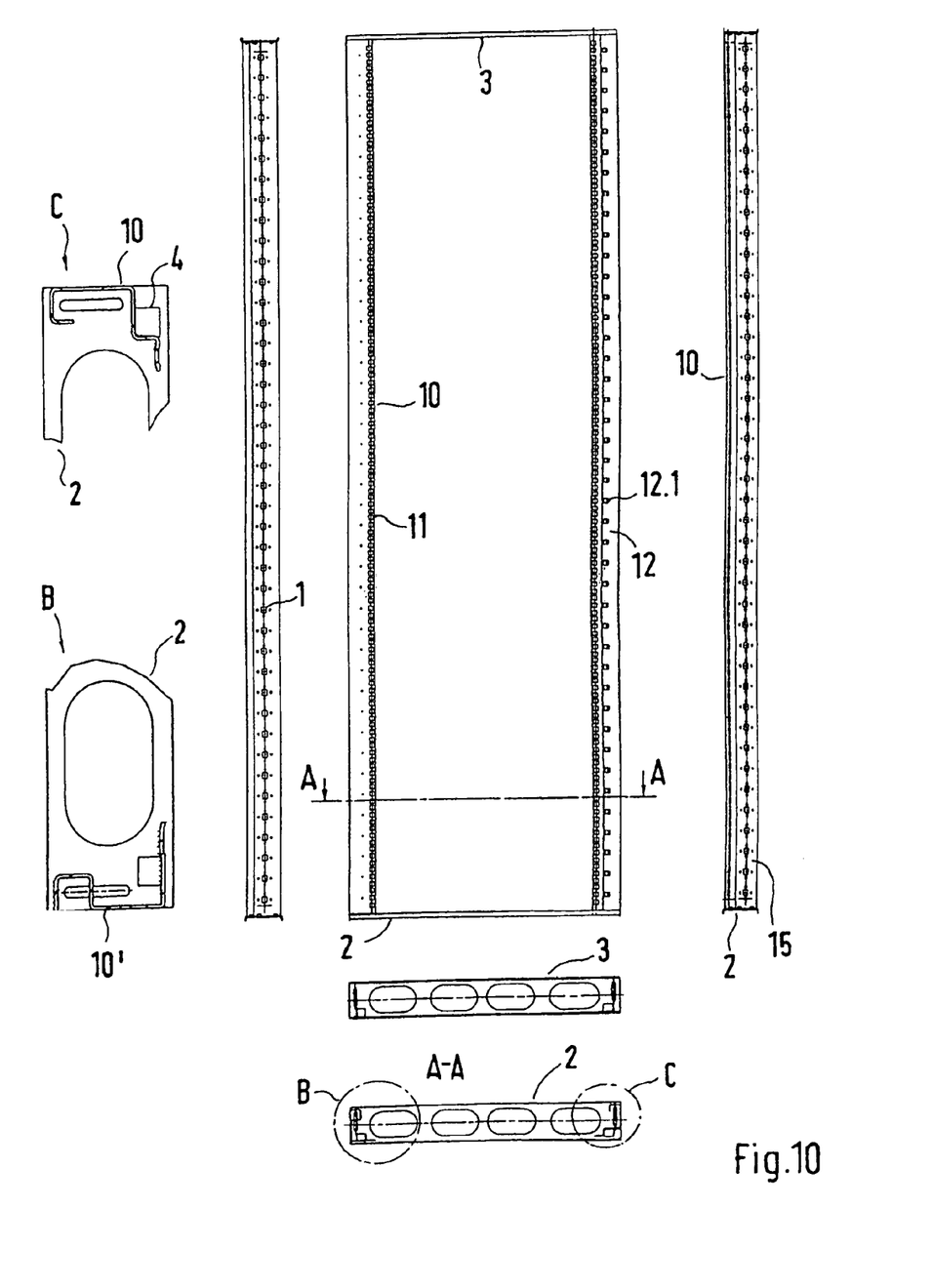

As shown in FIG. 10, a recess 4' for downwardly displacing antenna strip 30 may also be formed into lower frame leg 2. Both vertical mounting profiles 10, 10' may comprise the same or a different construction, as shown in enlarged detail views B and C.

Figure 11:
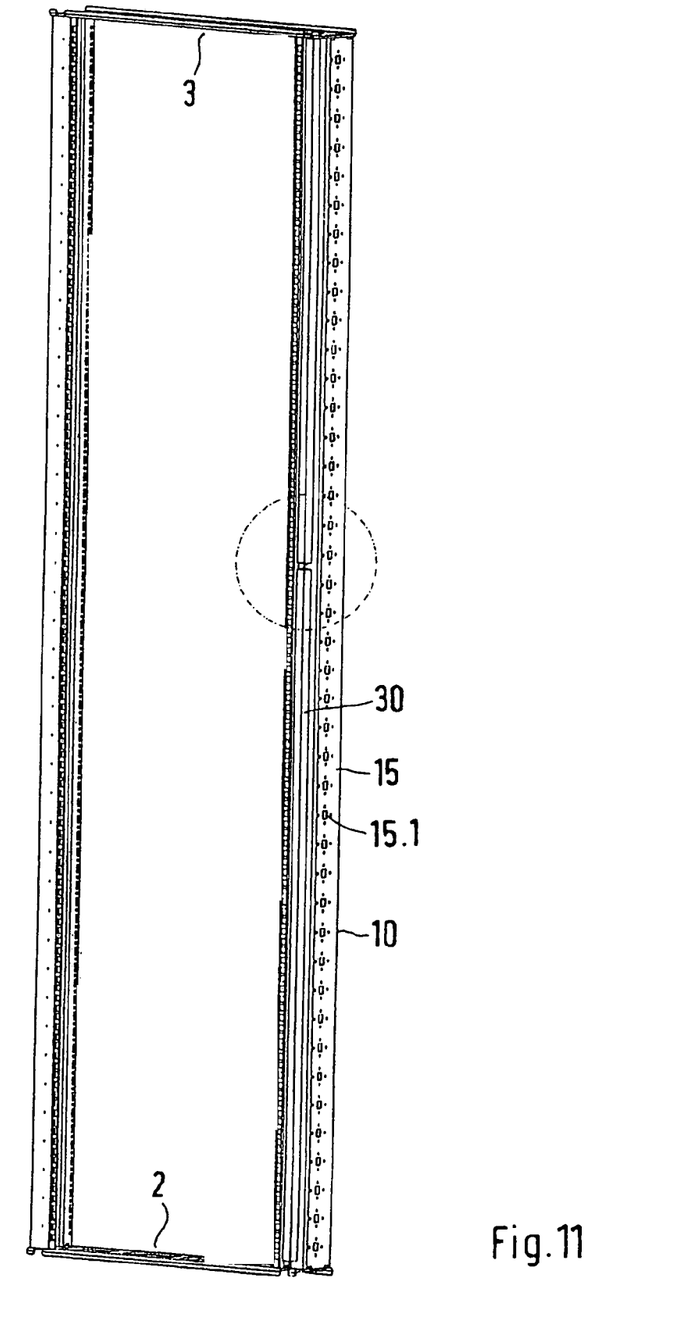
Figure 12:
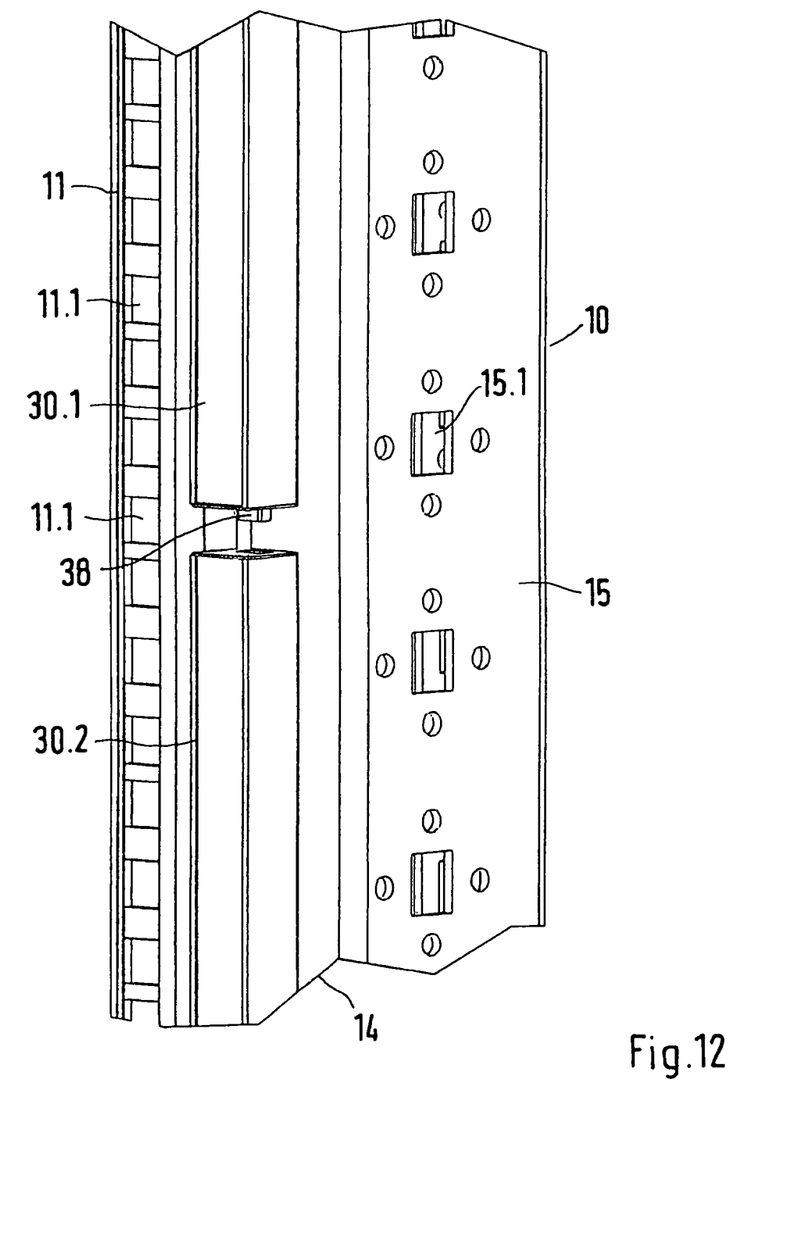

As it is shown in FIG. 11 and in the enlarged detailed illustration of FIG. 12, strip module 30 can be composed of several strip modules 30.1, 30.2, which can be plugged together in an electrically conducting manner via a plug/coupling unit, whereby also a mechanical connection is achieved which, however, may additionally be completed by means of engagement elements or other plug elements.

Strip modules 30.1, 30.2 preferably extend over a number of units of height and comprise a length which is harmonized with different common heights of switchgear cabinets, so that the smallest module fits into a switchgear cabinet of smallest height and an antenna strip 30 for a higher switchgear cabinet is obtained by plugging a number of strip modules 30.1, 30.2 together.

Figure 13A:
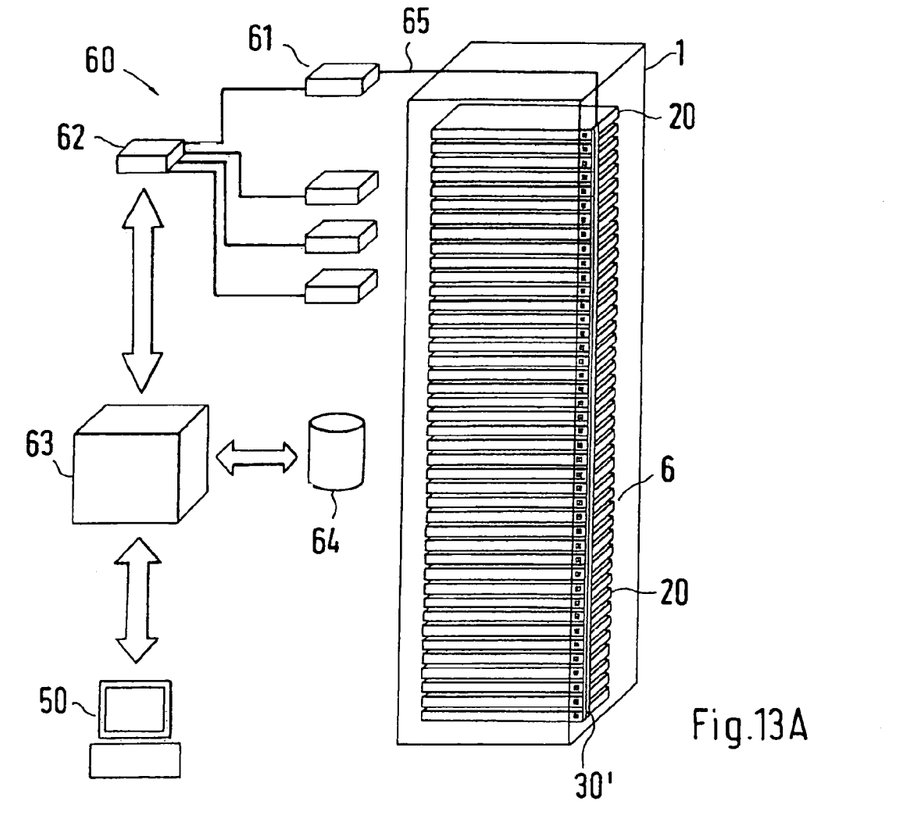
FIG. 13A a frame work of a switch gear cabinet or rack provided with a detector strip in the area of a front mounting profile and a connected monitoring and controlling unit, FIG. 13B a detail of the frame work in an upper corner region with a detector strip to be mounted and illuminating elements and detector elements arranged therein, and FIG. 13C an example of a screen representation of a mounting plane of a switchgear cabinet or rack having inserted installed units in form of server units.
Figure 13B:
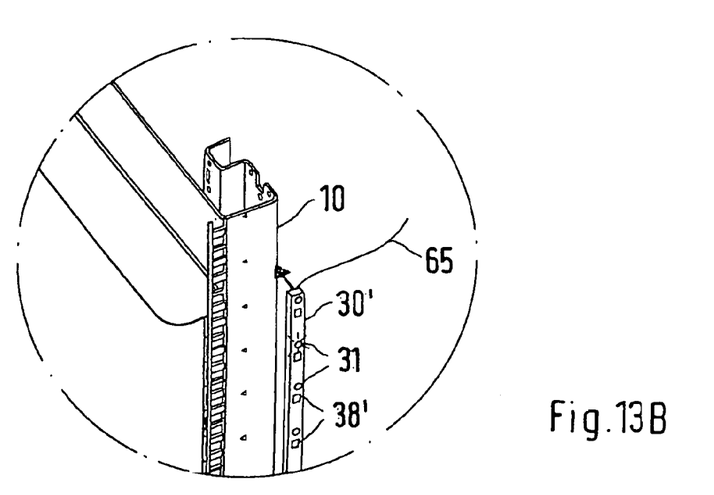

FIG. 13A shows a switchgear cabinet or a rack having a schematically illustrated framework 1 and installed units 20, e.g. in form of server units, at installation positions e.g. per unit of height HE which protrude into installation space 6. A detector strip 30' is arranged laterally in the front region of the framework in the region of a mounting profile 10 running in longitudinal direction of the mounting profile, which detector strip is connected for data transfer with a monitoring and control unit 60 via a data line 65 or, as an alternative, wirelessly, and may also be supplied with energy e.g. via data line 65 or a separate supply line, by said monitoring and control unit 60. Monitoring and control unit 60 comprises a control unit 61, an evaluation unit 62 connected thereto, an administration unit 63 and a data base unit 64 and is further connected to a display station having a screen 50 to produce screen displays 51, as illustrated e.g. in FIG. 13C. By means of the monitoring and control unit, for example control unit 61 or other places of monitoring and control unit 60, information which is received from transponder element 44 or another code carrier associated to a relevant installed unit 20 and transmitted via antenna elements or other detector elements 38' can be registered, processed and/or evaluated. Using this information which relates to the installation position of a relevant installed unit 20 or unoccupied installation positions of the switchgear cabinet or rack and/or relevant states of installed units 20, illuminating elements 31 can be driven to produce an optical display at the relevant installation position. Energy supply of illuminating elements 31 thereby can be achieved via data line 65 or also via a separate supply line. It is also conceivable to drive illuminating elements 31 immediately via respective neighboring detector elements 38' or antenna elements, respectively, e.g. by means of connecting through a semiconductor switch member.

Driving of illuminating elements 31 may e.g. configured such that illuminating elements aside unoccupied installation positions are driven dark or are driven in a different color than illuminating elements 31 aside occupied installation positions. Identification of installation positions from which, e.g. for maintenance purposes, installed units 20 are temporarily removed, may e.g. occur by flash operation of the associated illuminating elements 31.

Illuminating elements 31 are mounted on a board which is e.g. fixed at ribs 37. On this board or on another board, also data lines and/or supply line(s) may be applied.

Figure 13C:
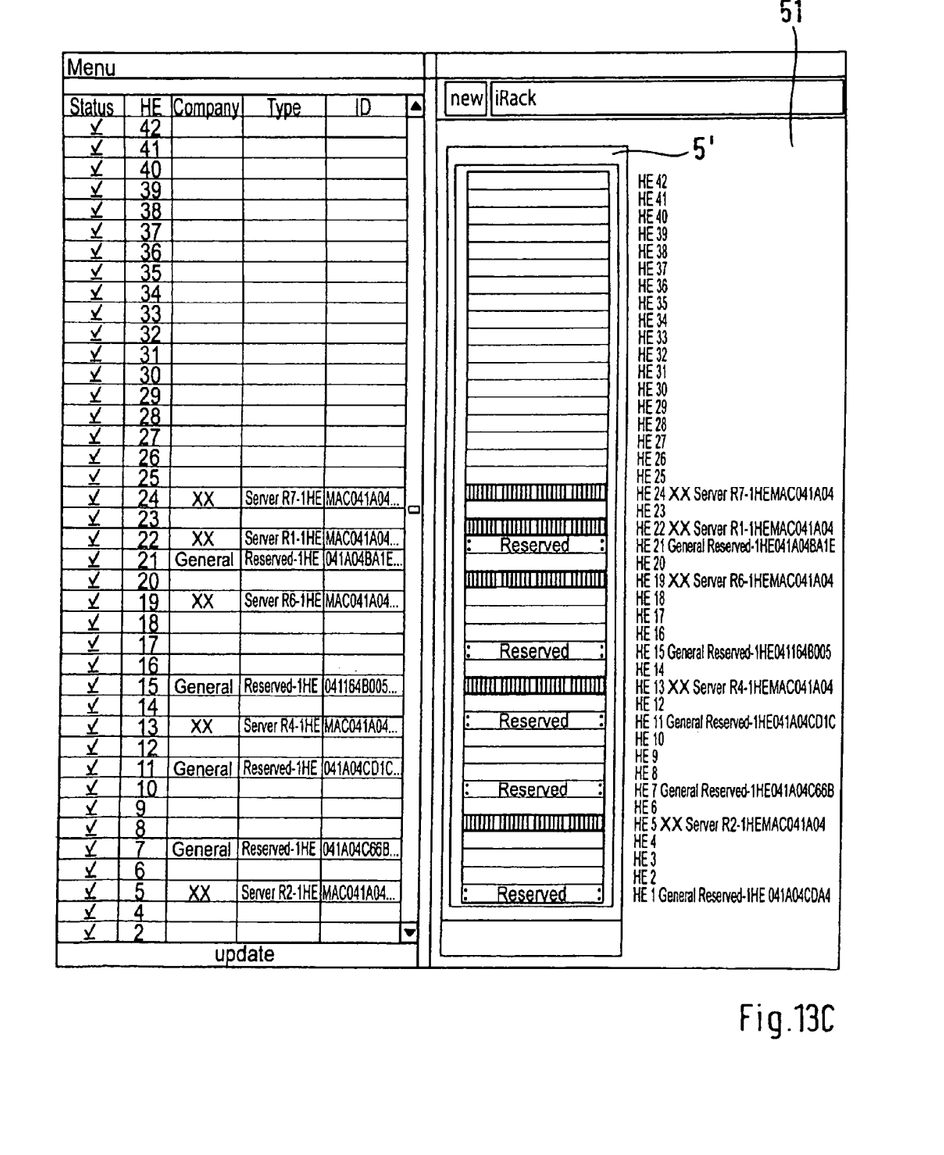

FIG. 13C shows an example of a display on a screen of a remote display station, wherein the mounting plane of a switchgear cabinet or rack together with its units of height HE1 to HE42 with occupied installation positions is represented on a display screen 50. Further to the mounting plane additional information with respect to the individual installed units, for example server units, is faded in which reproduces the current status and characteristics of the installed units 20. Such information can be partly stored, on the other hand produced in transponder elements 44, in particular RFID tags and transferred via the antenna elements and the control unit. Further, the information contained in the RFID tags and transferred to the control unit, register means or superordinate monitoring means can be supplemented with further information with respect to installed units 20, such as e.g. technical data, which is stored therein.

The invention claimed is:

1. A switchgear cabinet or rack comprising a mounting unit, the front of which has vertical mounting profiles that laterally delimit an installation space for installed user-side units, said profiles having fixing sections for attaching mounting sections of the installed units, and comprising components of a detection device for determining the presence of an installed unit in an installation position of the installation space, wherein the components of the detection device have a vertical detector strip that is attached to a mounting profile and contains detector elements associated with the installed positions and arranged on or in said detector strip and transponders that are provided on the installed units, the information from said transponders being transmitted for evaluation via the detector elements to a monitoring and control unit, either wirelessly or by wire, light-emitting diodes being mounted on or in the detector strip, said light-emitting diodes being associated with the installation positions, wherein the monitoring and control unit is configured for driving the light-emitting diodes in a manner dependent on the information of the transponders that is transmitted to the monitoring and control unit.

2. The switchgear cabinet or rack of claim 1, wherein said light-emitting diodes and said detector elements at least partly share data lines and/or supply lines which are arranged in said detector strip.

3. The switchgear cabinet or rack of claim 1, wherein said light-emitting diodes are respectively controllable for emitting light of different color and/or temporal illuminating frequency.

4. The switchgear cabinet or rack of claim 1, wherein said detector strip comprises a housing body having a hollow profile.

5. The switchgear cabinet or rack of claim 4, wherein said hollow profile comprises a square, rectangular, round, C-shaped or U-shaped cross section and is provided on its front in a mounted state with a transparent cover part at least in sections in front of said light-emitting diodes.

6. The switchgear cabinet or rack of claim 5, wherein said hollow profile having U-shaped cross section comprises a flat base with perpendicularly oriented lateral legs which are as long as, longer than or shorter than said base leg.

7. The switchgear cabinet or rack of claim 6, wherein said lateral legs are provided with retaining grooves on their inner side in the region of their exposed longitudinal edges which oppose each other with their opening faces and which forwardly and rearwardly engage behind the inserted cover part along the longitudinal edges thereof.

8. The switchgear cabinet or rack of claim 1, wherein said detector strip is configured as antenna strip and said detector elements are configured as antenna.

9. The switchgear cabinet or rack of claim 1, wherein said detector strip is configured as antenna strip and said detector elements are configured as antenna elements and said transponders are configured as RFID tags.

10. The switchgear cabinet or rack of claim 1, wherein said fixing sections are flat and lie on a front face mounting plane, said detector strip lies with its front face on the mounting plane or is set back in relation 5 1-thereto by a maximum of 10 mm and the relevant transponder is arranged in front of the front of said detector strip and is attached on a support section of a retaining element overlapping said detector strip, which element is attached to the neighboring mounting section of the associated installed unit via a connecting section.

11. The switchgear cabinet or rack of claim 10, wherein said mounting profile comprises a cavity which is at least partly adapted to the cross section of said detector strip, having an abutment section which is set back in relation to the mounting plane at least by the cross section depth of the detector strip and an inner boundary wall delimiting said cavity on its face facing the installation space, said abutment section and said inner boundary wall are arranged perpendicularly with respect to another in cross section of said cavity, wherein said abutment section is aligned parallel to the mounting plane and said boundary wall merges perpendicularly into said fixing section via an intermediate section or immediately.

12. The switchgear cabinet or rack of claim 10, wherein said retaining element is flat and is arranged with its connecting section on the rear of said mounting section which is also flat and is pressed therewith against the front of the fixing section and said support section extends in its height over a fraction of the connecting section.

13. The switchgear cabinet or rack of claim 11, wherein a row of retaining holes is arranged in said bearing section having retaining holes arranged with regular grid spacing and said retaining holes are square or rectangular with longitudinal sides running in longitudinal direction of said mounting profile and said-detector strip being provided with retaining hooks on its rear facing to said bearing section which are harmonized to the spacing of the retaining holes or a multiple thereof and comprise vertical hook sections which possess a smaller length than the clear opening width of the retaining holes in a vertical direction and which are spaced from the rear outer face of the detector strip so that they engage behind a wall section of the bearing section surrounding said retaining holes.

14. The switchgear cabinet or rack of claim 1, wherein said light-emitting diodes are arranged in longitudinal direction of said detector strip in regular grid spacing within grid of a unit of height HE an integer multiple thereof or in regular partial spacing thereof, are individually controllable and are, in an illuminating state, accurately visible through said transparent cover part, and antenna elements, which are spaced in longitudinal direction of said antenna strip, are arranged in the interior of said antenna strip within grid of a unit of height HE or an integer multiple thereof or in regular partial spacing thereof.

15. The switchgear cabinet or rack of claim 1, wherein said light emitting diodes provide a visually recognizable indication of installation position to a viewer.

\* \* \* \* \*